(12) United States Patent
Shimanouchi et al.

(10) Patent No.: US 8,618,715 B2
(45) Date of Patent: Dec. 31, 2013

(54) ELECTROSTATIC ACTUATOR AND DRIVING METHOD THEREOF

(75) Inventors: Takeaki Shimanouchi, Kawasaki (JP); Masahiko Imai, Kawasaki (JP); Takashi Katsuki, Kawasaki (JP); Osamu Toyoda, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 297 days.

(21) Appl. No.: 13/018,696

(22) Filed: Feb. 1, 2011

(65) Prior Publication Data
US 2011/0221300 A1  Sep. 15, 2011

(30) Foreign Application Priority Data
Mar. 11, 2010 (JP) .................. 2010-054430

(51) Int. Cl.
 H02N 1/00 (2006.01)
 G09G 3/34 (2006.01)
(52) U.S. Cl.
 USPC ............................ 310/309; 345/85; 318/116
(58) Field of Classification Search
 USPC ................ 310/309; 318/116; 385/18; 345/85
 See application file for complete search history.

(56) References Cited

U.S. PATENT DOCUMENTS

| | | | |
|---|---|---|---|
| 6,391,675 B1 * | 5/2002 | Ehmke et al. | 438/53 |
| 6,670,864 B2 * | 12/2003 | Hyvonen et al. | 333/32 |
| 6,806,988 B2 * | 10/2004 | Onuki et al. | 359/253 |
| 7,297,571 B2 * | 11/2007 | Ziaei et al. | 438/106 |
| 2001/0054937 A1 * | 12/2001 | Hyvonen et al. | 333/32 |
| 2002/0036304 A1 | 3/2002 | Ehmke et al. | |
| 2002/0074896 A1 * | 6/2002 | Kasahara | 310/309 |
| 2004/0032185 A1 | 2/2004 | Kato | |
| 2006/0125746 A1 * | 6/2006 | Sallese et al. | 345/85 |
| 2006/0127085 A1 * | 6/2006 | Matsuki et al. | 396/483 |
| 2007/0039147 A1 * | 2/2007 | Shimanouchi et al. | 29/25.03 |
| 2008/0180872 A1 * | 7/2008 | Mishima et al. | 361/139 |

(Continued)

FOREIGN PATENT DOCUMENTS

| | | |
|---|---|---|
| CN | 101231921 | 7/2008 |
| EP | 1168608 | 1/2002 |

(Continued)

OTHER PUBLICATIONS

G. Papaioannou, et al.; "Dielectric Charging in MEMS by Material, Structure and Temperature;" IEEE MTT-S International Microwave Symposium Workshop; Jun. 2009 (29 Sheets)/p. 5 of specification.

(Continued)

*Primary Examiner* — Tran Nguyen
*Assistant Examiner* — Alex W Mok
(74) *Attorney, Agent, or Firm* — Kratz, Quintos & Hanson, LLP

(57) ABSTRACT

A driving method for driving an electrostatic actuator including a fixed electrode and a movable electrode opposing each other with a dielectric layer interposed therebetween, includes applying a first voltage, between the fixed electrode and the movable electrode, to bring the movable electrode into contact with the dielectric layer, and applying a second voltage, between the fixed electrode and the movable electrode, after application of the first voltage is stopped and before the movable electrode moves away from the dielectric layer. Here, the second voltage has a polarity opposite to a polarity of the first voltage and an absolute value smaller than an absolute value of the first voltage.

6 Claims, 11 Drawing Sheets

(56) References Cited

U.S. PATENT DOCUMENTS

| | | | |
|---|---|---|---|
| 2008/0239611 A1* | 10/2008 | Yonezawa et al. | 361/139 |
| 2009/0244677 A1* | 10/2009 | Mizukami et al. | 359/225.1 |
| 2010/0142117 A1* | 6/2010 | Shimanouchi et al. | 361/278 |
| 2010/0254068 A1* | 10/2010 | Shimanouchi et al. | 361/278 |

FOREIGN PATENT DOCUMENTS

| | | |
|---|---|---|
| JP | 2002-36197 | 2/2002 |
| JP | 2004-61937 A1 | 2/2004 |
| JP | 2006-247820 A1 | 9/2006 |
| JP | 2007-242607 A1 | 9/2007 |

OTHER PUBLICATIONS

First Office Action issued Jun. 5, 2013 in counterpart application No. 201110043026.0 from the State Intellectual Property Office of the People's Republic of China with English translation (15 pages).
Search Report of R.O.C. issued Jul. 16, 2013 in Taiwanese counterpart application No. 100102835 with partial English translation.

* cited by examiner

ELECTROSTATIC ACTUATOR AND DRIVING METHOD THEREOF

CROSS-REFERENCE TO RELATED APPLICATION

This application is based upon and claims the benefit of priority of the prior Japanese Patent Application No. 2010-054430, filed on Mar. 11, 2010, the entire contents of which are incorporated herein by reference.

FIELD

The embodiments discussed herein are directed to an electrostatic actuator using, for example, a MEMS (Micro Electro Mechanical System) technology, and a driving method thereof.

BACKGROUND

In general, an electrostatic actuator is provided with two electrodes opposing each other with a gap interposed therebetween, and a distance between the two electrodes changes by an action of electrostatic attractive force exerted therebetween when a driving voltage is applied.

FIGS. 8A and 8B are cross sectional views illustrating an example of a conventional variable capacitance element 3 using an electrostatic actuator.

Referring to FIGS. 8A and 8B, the variable capacitance element 3 is provided, on a substrate 31, with a fixed electrode 32, a dielectric layer 33 covering the fixed electrode 32, a movable electrode 34 opposing the dielectric layer 33 with a gap interposed therebetween, a pair of support layers 35a and 35b supporting the movable electrode 34, and so on.

A short circuit caused by contact between the fixed electrode 32 and the movable electrode 34 is prevented by the dielectric layer 33.

A driving voltage V can be applied between the fixed electrode 32 and the movable electrode 34.

Referring to FIG. 8A, when no potential difference is applied between the fixed electrode 32 and the movable electrode 34, i.e., when the driving voltage V is zero, the movable electrode 34 is in a position away from the fixed electrode 32.

On the other hand, referring to FIG. 8B, when a predetermined potential difference is applied between the fixed electrode 32 and the movable electrode 34, the movable electrode 34 is attracted toward the fixed electrode 32 and brought into contact with the dielectric layer 33.

A capacitance C between the fixed electrode 32 and the movable electrode 34 becomes a minimum capacitance Cs when the movable electrode 34 is in the state illustrated in FIG. 8A, and becomes a maximum capacitance Cg when the movable electrode 34 is in the state illustrated in FIG. 8B.

When the variable capacitance element 3 is used in a digital application, the capacitance C is changed either to the minimum capacitance Cs or the maximum capacitance Cg for use by controlling the driving voltage V.

FIG. 9 is a diagram illustrating an example of a relationship (C-V characteristics) between the capacitance C and the driving voltage V applied to the variable capacitance element 3.

As illustrated in FIG. 9, when the driving voltage V having a positive polarity is applied and increased, the capacitance C keeps the minimum capacitance Cs for a while, sharply increases when the driving voltage V passes a pull-in voltage Vpi1, and thereafter reaches the maximum capacitance Cg. Then, when the driving voltage V is decreased, the capacitance C keeps the maximum capacitance Cg for a while, sharply decreases when the driving voltage V passes a pull-off voltage Vpo1, and thereafter returns to the minimum capacitance Cs.

Since it is the potential difference that causes the electrostatic attractive force when applied between the fixed electrode 32 and the movable electrode 34, application of a driving voltage V having a negative polarity also brings about the same characteristics.

Here, the change in the capacitance C relative to the change in the driving voltage V has different paths, i.e., one when the driving voltage V increases and the other when the driving voltage V decreases. In other words, it exhibits a type of hysteresis phenomenon, and the pull-in voltage Vpi1 and the pull-off voltage Vpo1 are different from each other. The same is also applied to the pull-in voltage Vpi2 and the pull-off voltage Vpo2.

In the variable capacitance element 3, when the capacitance C is changed to the minimum capacitance Cs, the driving voltage V is set to an off-voltage Voff (zero). When the capacitance C is changed to the maximum capacitance Cg, the driving voltage V is set to an on-voltage Von1 or Von2.

If a driving voltage V with a same polarity is kept applied to change the capacitance C, then positive or negative charges accumulate in the dielectric layer 33, and the dielectric layer 33 is electrically charged.

FIGS. 10A and 10B are diagrams illustrating examples of a relationship (C-V characteristics) between the capacitance C and the driving voltage V of the variable capacitance element 3 while the dielectric layer 33 is kept electrically charged.

When the dielectric layer 33 is turned to a charged state, the movable electrode 34 is influenced by the electrostatic force caused by the charge. For this reason, the C-V characteristics of the variable capacitance element 3 exhibit characteristics different from those when the variable capacitance element 3 is not charged.

As illustrated in FIG. 10A, for example, in a state where the dielectric layer 33 is negatively charged, the C-V characteristics are shifted toward a negative side of the driving voltage V as compared with the state where the dielectric layer 33 is not charged. As illustrated in FIG. 10B, in a state where the dielectric layer 33 is positively charged, the C-V characteristics are shifted toward a positive side of the driving voltage V as compared with the state where the dielectric layer 33 is not charged.

If the C-V characteristics are shifted in this way, a driving voltage V that is supposed to cause the minimum capacitance Cs or the maximum capacitance Cg may not bring the capacitance C into such a value.

For example, referring to FIG. 10A, when the driving voltage V is set to the off-voltage Voff, the capacitance C may not change to the intended minimum capacitance Cs. This is because, for example, the C-V characteristics are shifted toward the negative side of the driving voltage V; the polarity of the pull-off voltage Vpo1 turns to negative from positive; and the movable electrode 34 is kept stuck onto the dielectric layer 33 even if the driving voltage V is brought back to the off-voltage Voff.

As described above, the charging phenomenon of the dielectric layer 33 works as an obstacle to the stable operation of the variable capacitance element 3.

According to "G. Papaioannou and J. Papapolymerou, *Dielectric Charging in MEMS by Material, Structure and Temperature*, in IEEE MTT-S International Microwave Symposium Workshop, June 2009", the reason why the dielectric layer 33 is charged is explained as follows.

FIGS. 11A and 11B are diagrams schematically depicting the phenomenon in which charges accumulate in the dielectric layer 33.

As illustrated in FIGS. 11A and 11B, when the dielectric layer 33 is observed microscopically, asperities are present on the surface thereof.

For this reason, referring to FIG. 11A, when the movable electrode 34 is in contact with the dielectric layer 33, there are, on the surface of the dielectric layer 33, contact portions Tc which actually make contact with the movable electrode 34 and non-contact portions NTc which do not make contact with the movable electrode 34. In this state, positive or negative charges move to the contact portions Tc from the movable electrode 34, i.e., a type of current I flows. On the other hand, such charges do not move to the non-contact portions NTc.

Thereafter, when the movable electrode 34 moves away from the fixed electrode 32, electrostatic discharge is caused. However, a part of charges that have been injected in the vicinity of the contact portions Tc remains there without being released as illustrated in FIG. 11B.

This causes a difference in the state of charges between the vicinity of the contact portions TC and the vicinity of the non-contact portions NTc. As a result, the dielectric layer 33 is either positively or negatively charged.

Japanese Laid-open Patent Publication No. 2006-247820 proposes a driving method for switching the polarity of the driving voltage to be applied each time the driving is performed, i.e., bipolar driving.

In view of preventing the movable electrode from sticking to the fixed electrode by generation of forces such as the Van der Waals' forces, Japanese Laid-open Patent Publication No. 2004-61937 proposes a similar driving method.

Also, Japanese Laid-open Patent Publication No. 2007-242607 proposes to detect an amount of charges accumulated in an insulating film, and vary a driving voltage in accordance with the detected result.

Assuming that the above-mentioned contact portions correspond to identical locations in each of the driving, it appears that charging of the dielectric layer can be suppressed because charges that move through the contact portions cancel each other by performing the bipolar driving.

In actual cases, however, the contact portions do not necessarily correspond to the identical locations in each of the driving. Therefore, the bipolar driving does not work as an effective solution.

Further, it is complicated and troublesome to implement a method for varying the driving voltage in accordance with the result obtained by detecting an among of charges accumulated in the dielectric layer, because such a method requires a circuit for detecting the charges and various types of control related thereto.

SUMMARY

According to an aspect of the invention (embodiment), a driving method for driving an electrostatic actuator including a fixed electrode and a movable electrode opposing each other with a dielectric layer interposed therebetween, includes applying a first voltage, between the fixed electrode and the movable electrode, to bring the movable electrode into contact with the dielectric layer, and applying a second voltage, between the fixed electrode and the movable electrode, after application of the first voltage is stopped and before the movable electrode moves away from the dielectric layer. Here, the second voltage has a polarity opposite to a polarity of the first voltage and an absolute value smaller than an absolute value of the first voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First, a description will be given of a variable capacitance element 1 as an example of a MEMS device using an electrostatic actuator which serves as a target to be driven in a driving method used in an embodiment described hereinafter.

Figure 1A:
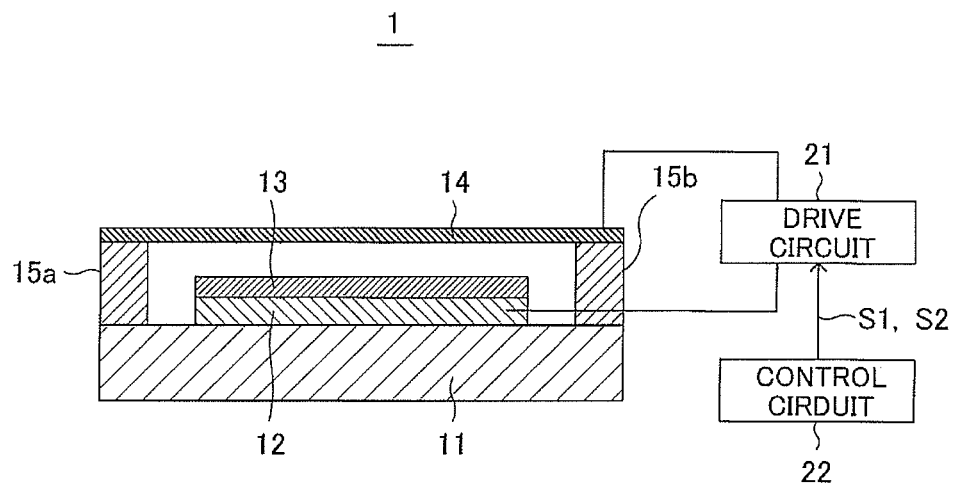
FIGS. 1A and 1B are cross sectional views illustrating an example of a variable capacitance element.
Figure 1B:
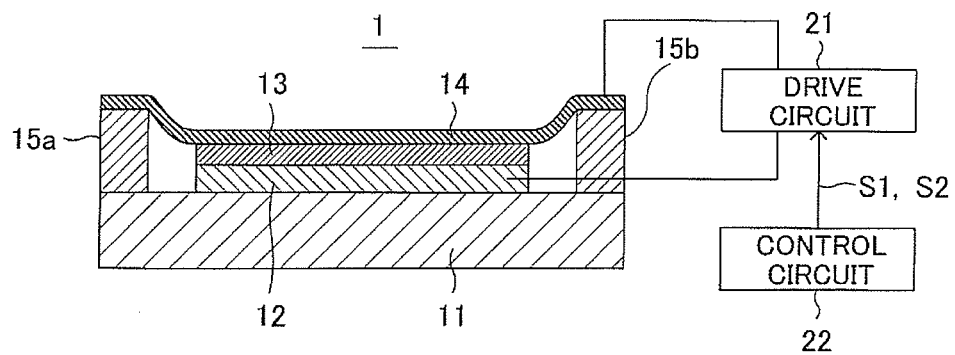

FIGS. 1A and 1B are cross sectional views illustrating an example of the variable capacitance element 1. FIG. 1A is a cross sectional view in which a movable electrode 14 is not displaced, and FIG. 1B is a cross sectional view in which the movable electrode 14 is displaced.

As illustrated in FIGS. 1A and 1B, the variable capacitance element 1 is provided, on a substrate 11 made of glass or silicon, with a fixed electrode 12, a dielectric layer 13, the movable electrode 14, and a pair of support layers 15a and 15b.

The fixed electrode 12 is formed of a conductive material such as gold (Au), aluminum (Al), or copper (Cu) and formed on a surface of the substrate 11.

The dielectric layer 13 is formed of a dielectric material such as oxide silicon ($SiO_2$) or alumina ($Al_2O_3$) and is formed in such a manner to cover an upper surface of the fixed electrode 12.

The movable electrode 14 is formed of a conductive material such as gold (Au), aluminum (Al), or copper (Cu) and formed above the dielectric layer 13 in a manner to face an upper surface of the dielectric layer 13 with a gap interposed between the movable electrode 14 and the dielectric layer 13. The movable electrode 14 is supported by support layers 15a and 15b formed on a lower surface thereof in a beam supporting manner at both ends thereof.

The support layers 15a and 15b are formed of a conductive material such as gold (Au), aluminum (Al), or copper (Cu) and formed on the surface of the substrate 11 in a manner to support the movable electrode 14 at both ends thereof.

The fixed electrode 12 and the movable electrode 14 are connectable to a drive circuit 21, and a driving voltage V is applied therebetween by the drive circuit 21. For example, the fixed electrode 12 is connected to the ground, and the driving voltage V is applied to the movable electrode 14. Alternatively, the movable electrode 14 is connected to the ground, and the driving voltage V is applied to the fixed electrode 12.

Figure 2:
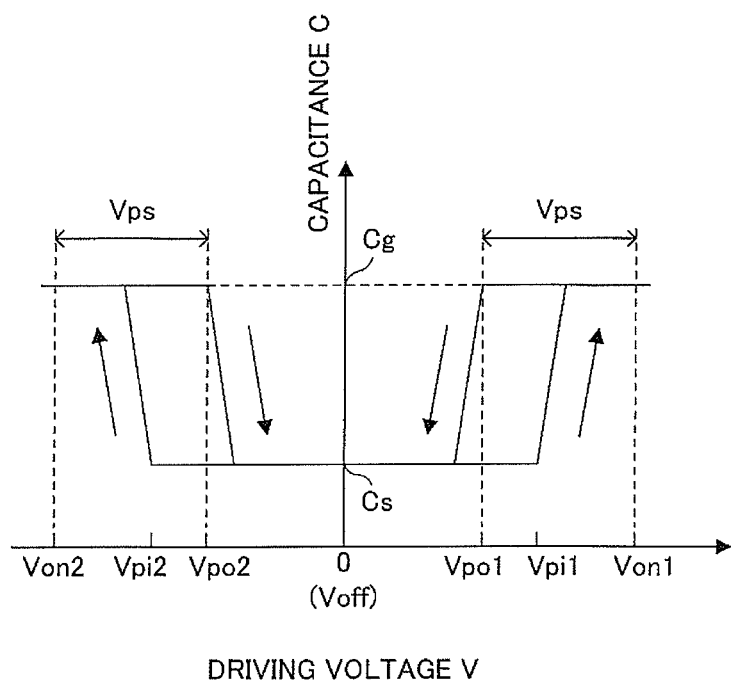
FIG. 2 is a diagram illustrating an example of a relationship (C-V characteristics) between a capacitance and a driving voltage.

FIG. 2 is a diagram illustrating an example of a relationship (C-V characteristics) between a capacitance C and the driving voltage V.

In FIG. 2, when the driving voltage V is equal to an off-voltage Voff (zero volts), i.e., when the driving voltage V is not applied, the movable electrode 14 is in a state separated away from the upper surface of the dielectric layer 13. Referring to FIG. 1A, this means that the variable capacitance element 1 is in a pull-off state in which the movable electrode 14 is pulled off. At this moment, the capacitance C between the fixed electrode 12 and the movable electrode 14 is the minimum capacitance Cs.

When the driving voltage V having a positive polarity is applied, i.e., where the driving voltage V is equal to or higher than a positive pull-in voltage Vpi1, or above the positive pull-in voltage Vpi1 to be exact, the electrostatic attractive force exerted between the fixed electrode 12 and the movable electrode 14 becomes equal to or higher than a predetermined value. Then, the movable electrode 14 is attracted toward a side of the fixed electrode 12 and brought into contact with the upper surface of the dielectric layer 13. In other words, referring to FIG. 1B, the variable capacitance element 1 is turned into an on-state while the movable electrode 14 is pulled in. At this moment, the capacitance C between the fixed electrode 12 and the movable electrode 14 becomes the maximum capacitance Cg.

From this state, when the driving voltage V becomes equal to or lower than the positive pull-off voltage Vpo1, i.e., slightly lower than the positive pull-off voltage Vpo1 to be exact, the electrostatic attractive force exerted between the fixed electrode 12 and the movable electrode 14 becomes equal to or smaller than a predetermined value. Then, the movable electrode 14 is separated away from the upper surface of the dielectric layer 13. In other words, referring to FIG. 1A, the variable capacitance element 1 is turned into an off-state while the movable electrode 14 is pulled off. At this moment, the capacitance between the fixed electrode 12 and the movable electrode 14 becomes the minimum capacitance Cs.

Since the electrostatic attractive force is generated by applying a potential difference between the fixed electrode 12 and the movable electrode 14, the same characteristics are provided when the driving voltage V having a negative polarity is applied.

Referring to FIG. 1B, when the driving voltage V becomes equal to or lower than a negative pull-in voltage Vpi2, the variable capacitance element 1 turns into the on-state, and the capacitance C becomes the maximum capacitance Cg. Referring to FIG. 1A, from this state, when the driving voltage V becomes equal to or higher than a negative pull-off voltage Vpo2, the variable capacitance element 1 turns into the off-state, and the capacitance C becomes the minimum capacitance Cs.

[First Embodiment]

Next, a driving method according to a first embodiment will be described by taking an example in which the driving method is applied to the variable capacitance element 1 described above.

Figure 3:
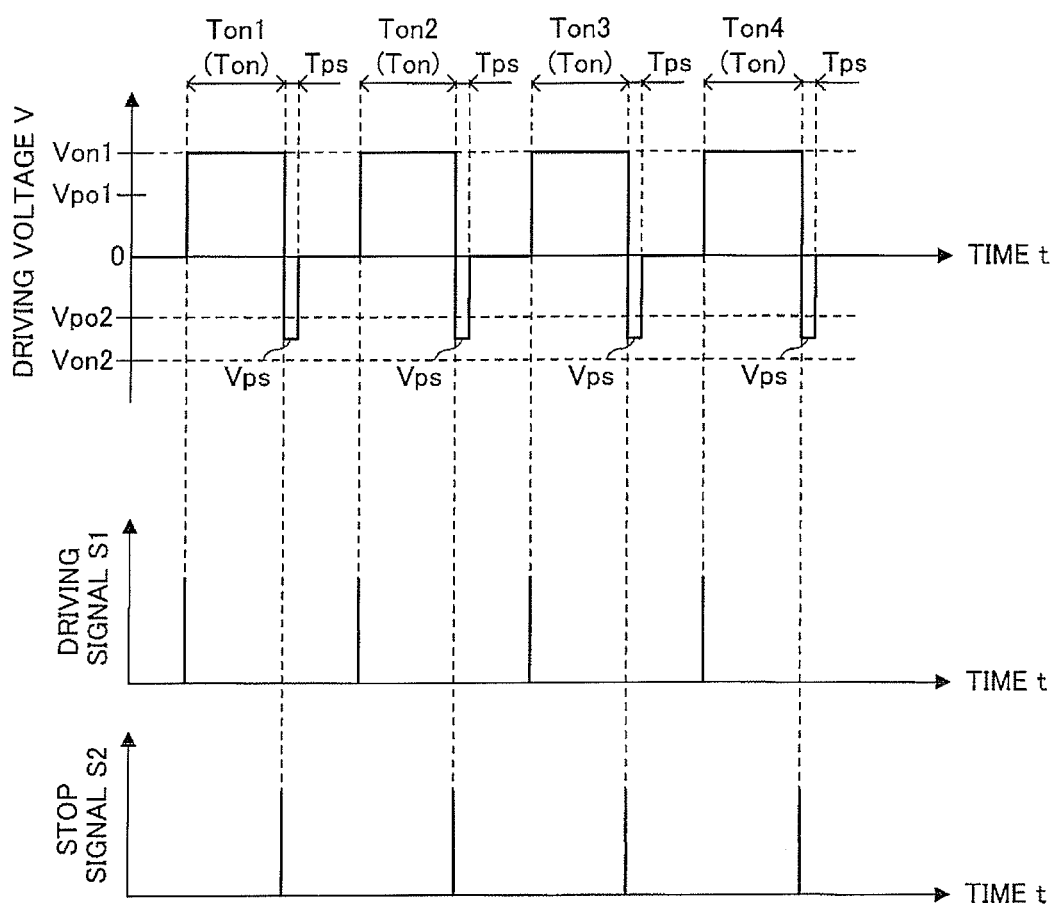
FIG. 3 is a diagram illustrating an example of an input signal and a driving waveform.

FIG. 3 is a diagram illustrating examples of an input signal fed into the drive circuit 21 and a waveform of the driving voltage V applied by the drive circuit 21. FIGS. 4A, 4B, 5A, and 5B are diagrams schematically depicting how the charging takes place in the dielectric layer 13.

Referring to FIGS. 1A and 1B, a driving signal S1 commanding driving of the variable capacitance element 1, i.e., commanding a shift to the on-state, is fed into the drive circuit 21 from a control circuit 22.

When the driving signal S1 is fed in, the drive circuit 21 applies, between the fixed electrode 12 and the movable electrode 14, one of a positive on-voltage Von1 and a negative on-voltage Von2 as the driving voltage V.

Hereinafter, if no distinction is required between the on-voltages Von1 and Von2, the on-voltage may be referred to as "on-voltage Von". Similarly, the pull-in voltages Vpi1 and Vpi2, and the pull-off voltages Vpo1 and Vpo2 may be also referred to as "pull-in voltage Vpi" and "pull-off voltage Vpo", respectively.

In the first embodiment, every time the driving signal S1 is fed in, i.e., every time the variable capacitance element 1 is driven, the drive circuit 21 repeatedly applies the on-voltage Von having an identical polarity. In the example illustrated in FIG. 3, the on-voltage Von1 having the positive polarity is applied for individual driving at the on-times Ton1, Ton2, Ton3, and Ton4.

The absolute values of the on-voltages Von1 and Von2 are set to values larger than the absolute values of the pull-in voltages Vpi1 and Vpi2, respectively.

Since the on-voltage Von is a voltage for bringing the movable electrode 14 into contact with the upper surface of the dielectric layer 13, it is sometimes called a contact bias in general.

Figure 4A:
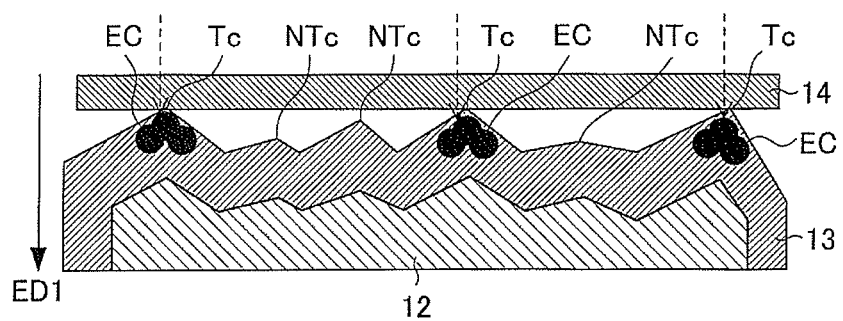
FIGS. 4A and 4B are diagrams schematically illustrating how charging takes place in a dielectric layer.

As illustrated in FIG. 4A, while the on-voltage Von is applied by the drive circuit 21, the movable electrode 14 is in contact with the upper surface of the dielectric layer 13. Here, however, there are, on the upper surface of the dielectric layer 13, contact portions Tc which actually make contact with the movable electrode 14 and non-contact portions NTc which do not actually make contact with the movable electrode 14.

In this state, positive or negative charges EC move through an interface between the lower surface of the movable electrode 14 and the contact portions Tc, and positive or negative charges EC are injected into the vicinity of the contact portions Tc from the movable electrode 14.

Whether positive or negative charges EC are injected depends on a direction of an electric field ED1 applied between the fixed electrode 12 and the movable electrode 14. In other words, it depends on which one of the fixed electrode 12 and the movable electrode 14 the driving voltage V is applied to, and which one of the positive on-voltage Von1 and the negative on-voltage Von2 is applied as the driving voltage V. For example, in the case where the fixed electrode 12 is connected to the ground of the power source, and the positive on-voltage Von1 is applied to the movable electrode 14, positive charges EC are injected into the dielectric layer 13 from the movable electrode 14.

In this way, the vicinity of the contact portions Tc is biased toward one of positive and negative charged states. On the other hand, the vicinity of the non-contact portions NTc is not biased toward either of them. This causes a difference in charged state between the vicinity of the contact portions Tc and the vicinity of the non-contact portions NTc, and, as a result, the dielectric layer 13 is charged either positively or negatively.

Referring to FIGS. 1A and 1B, a stop signal S2 that commands a stop in driving (shift to the off-state) of the variable capacitance element 1 is fed into the drive circuit 21 from the control circuit 22 at an arbitrary moment or a predetermined time after the driving signal S1 is fed in.

Here, the on-time Ton, which is a period from when the driving signal S1 is fed in until when the stop signal S2 is fed in, differs depending on the purpose of use of the variable capacitance element 1. That is, for example, a period of a few milliseconds, a few seconds, a few minutes, a few hours, a few hundreds hours, or the like.

The drive circuit 21, when the stop signal S2 is fed thereto, applies a reverse polarity pulse Vps as the driving voltage V between the fixed electrode 12 and the movable electrode 14 for a period of a pulse application period Tps, and, thereafter, changes the driving voltage V to the off-voltage Voff, i.e., zero volts. This means that the application of the driving voltage V is stopped. According to the example illustrated in FIG. 3, the reverse polarity pulse Vps is applied, for the pulse application period Tps, after each of the on-times Ton1, Ton2, Ton3, and Ton4 in each of which the on-voltage Von is applied, and, thereafter, the application of the driving voltage V is stopped. Switching from the on-voltage Von to the reverse polarity pulse Vps by the drive circuit 21 is performed instantaneously. It is preferable that the pulse application period Tps be shorter than the on-time Ton.

The reverse polarity pulse Vps is a pulsed voltage having a polarity opposite to that of the on-voltage Von that is applied to drive the variable capacitance element 1. According to the example illustrated in FIG. 3, the reverse polarity pulse Vps is a pulsed voltage having a negative polarity opposite to the positive on-voltage Von1.

In the first embodiment, since the polarity of the on-voltage Von is the same for each driving, the polarity of the reverse polarity pulse Vps remains the same for each driving.

Further, according to the example illustrated in FIG. 3, since the driving signal S1 is repeatedly fed in with a predetermined period, the on-voltage Von1 is applied repeatedly with a predetermined period.

The absolute value of the reverse polarity pulse Vps is smaller than, for example, the absolute value of the on-voltage Von applied immediately preceding thereto. In other words, the absolute value of the reverse polarity pulse Vps is set to a value equal to or smaller than the absolute value of the on-voltage Von applied immediately preceding thereto. It is preferable that the absolute value of the reverse polarity pulse Vps be set to a value equal to or larger than the absolute value of the pull-off voltage Vpo having a polarity identical therewith. At the same time, it is also preferable that the absolute value of the reverse polarity pulse Vps be set to a value equal to or smaller than the absolute value of the on-voltage Von having a polarity identical therewith. For example, the absolute value of the reverse polarity pulse Vps is set to a value equal to the absolute value of the on-voltage Von having the same polarity. According to the example illustrated in FIG. 3, the absolute value of the reverse polarity pulse Vps is set to a value larger than the absolute value of the negative pull-off voltage Vpo2 and smaller than the absolute value of the negative on-voltage Von2.

The pulse application period Tps of the reverse polarity pulse Vps is set in view of a material, a quality of the material, a thickness, and the like of the dielectric layer 13. For example, it is set to a value in the range of 1 μs to 10 ms, e.g., about 10 μs.

The absolute value of the pull-off voltage Vpo of the variable capacitance element 1 is smaller than the absolute value of the pull-in voltage Vpi having the same polarity (hysteresis characteristics), and the operation of the movable electrode 14 is accompanied by an action of inertia force. For this reason, the operation of the movable electrode 14 is slower than a speed when the driving voltage V switches and, for example, is at a speed of about 1 μs to 10 ms. This means that the responsiveness of the movable electrode 14 to the driving voltage V is not so high.

As a result, the movable electrode 14 remains in contact with the upper surface of the dielectric layer 13 during a period when the driving voltage V is switched from the on-voltage Von to the reverse polarity pulse Vps. In other words, while the movable electrode 14 remains in contact with the dielectric layer 13, the driving voltage V is switched from the on-voltage Von to the reverse polarity pulse Vps. This means that the reverse polarity pulse Vps is applied between the fixed electrode 12 and the movable electrode 14 after the application of the on-voltage Von is stopped and before the movable electrode 14 is spaced from the dielectric layer 13. Thus, no variation in the value of the capacitance C occurs during switching of the driving voltage V.

Figure 4B:
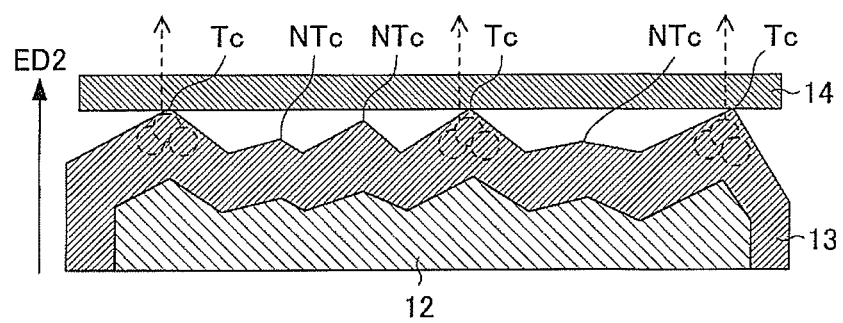

As illustrated in FIG. 4B, when the reverse polarity pulse Vps is applied by the drive circuit 21, the movable electrode 14 still remains in contact with the upper surface of the dielectric layer 13. The positions of the contact portions Tc and the positions of the non-contact portions NTc on the upper surface of the dielectric layer 13 are not changed from those when the on-voltage Von has been applied immediately before.

In this state, an electric field ED2 having a direction opposite to that when the on-voltage Von has been applied immediately before is applied between the fixed electrode 12 and the movable electrode 14. For this reason, in the interface between the lower surface of the movable electrode 14 and the contact portions Tc, charges move in a direction opposite to that when the on-voltage Von has been applied immediately before, and the charges EC that have been injected in the vicinity of the contact portions Tc are released to the movable electrode 14. Therefore, the charges EC that have been injected in the vicinity of the contact portions Tc are neutralized with the charges EC having a polarity opposite thereto.

With this arrangement, a difference in the state of charges between the contact portions Tc and the non-contact portions NTc becomes smaller, and the positive or negative charges of the dielectric layer 13 are removed, i.e., the charges of the dielectric layer 13 are canceled.

Figure 5A:
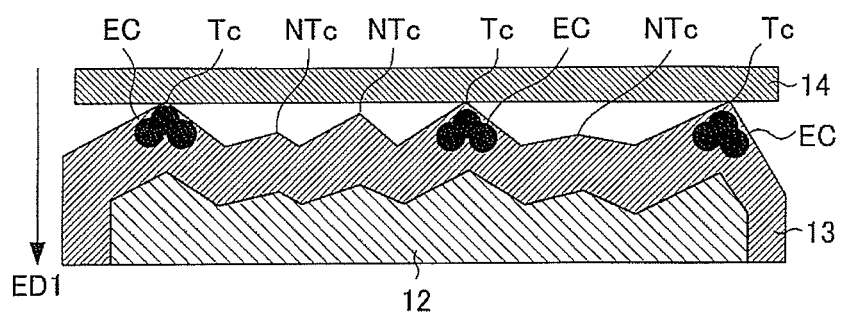
FIGS. 5A and 5B are diagrams schematically illustrating how charging takes place in a dielectric layer.
Figure 5B:
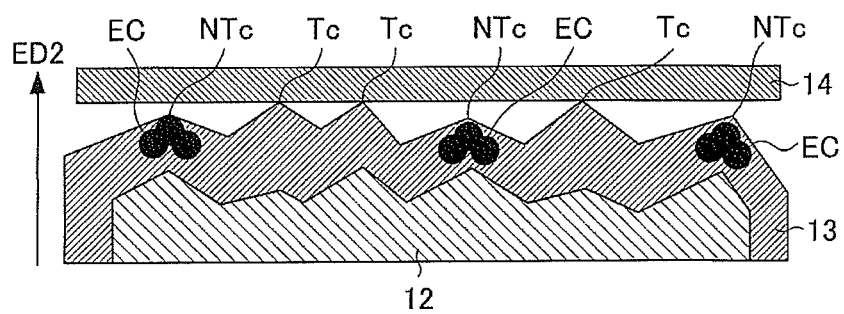

Here, if the reverse polarity pulse Vps is applied after the application of the on-voltage Von is temporarily suspended, the movable electrode 14 temporarily moves away from the upper surface of the dielectric layer 13. In such a case, depending on when the on-voltage Von is applied as illustrated in FIG. 5A and when the reverse polarity pulse Vps is applied as illustrated in FIG. 5B, the positions of the contact portions Tc may change. Therefore, there are cases where the charges of the dielectric layer 13 can not be removed even by applying the reverse polarity voltage Vps.

As described above, according to the driving method of the electrostatic actuator of this embodiment, the reverse polarity pulse Vps is applied before the application of the on-voltage Von is stopped for each driving. This removes the charges of the dielectric layer 13 caused by the application of the on-voltage Von for each driving.

Accordingly, when the electrostatic actuator is repeatedly driven, it is possible to suppress the charging of the dielectric layer 13 and perform stable operation of the electrostatic actuator as compared with the conventional driving method.

Incidentally, as a result of experiment, the number of driving that can be performed before the phenomenon in which the movable electrode 14 remains stuck to the dielectric layer 13 occurs is about $1 \times 10^7$ in the conventional case. However, according to this embodiment, it was confirmed that this figure was improved to about $1 \times 10^9$.

[Second Embodiment]

Next, a description will be given of a driving method according to a second embodiment by taking the variable capacitance element 1 as an example.

Figure 6:
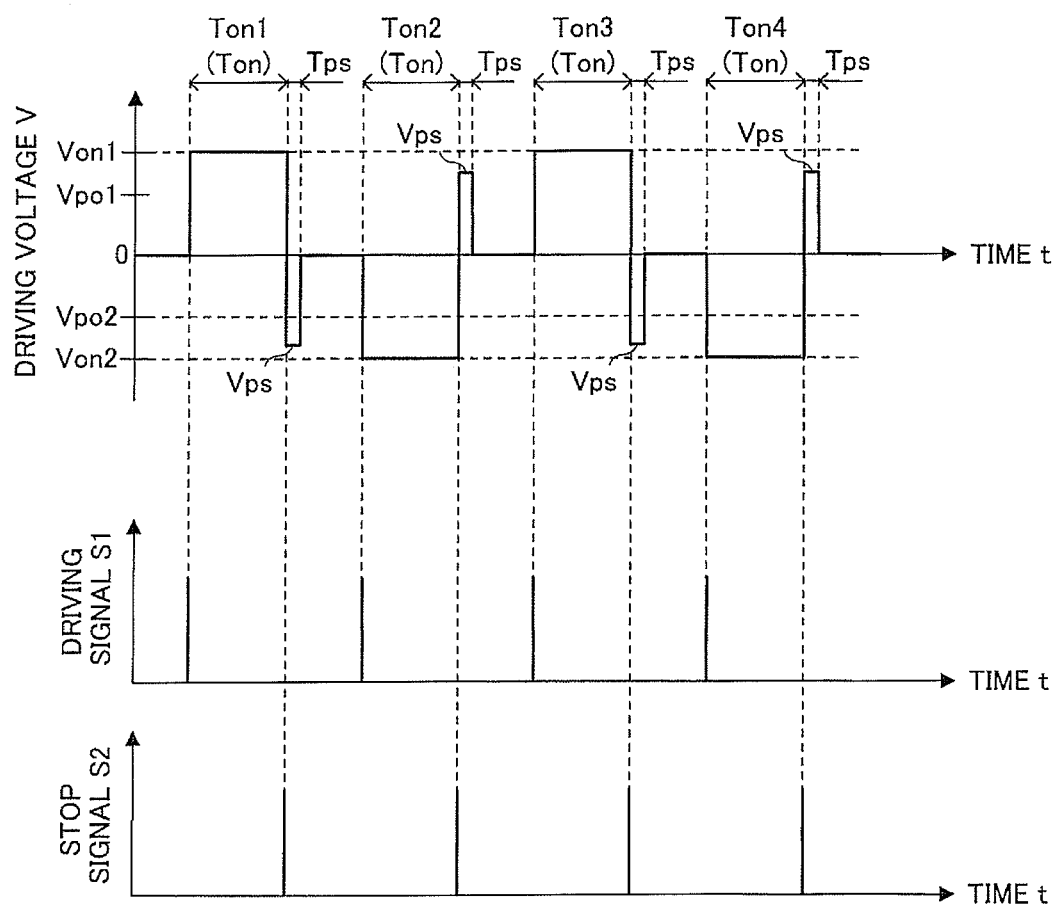
FIG. 6 is a diagram illustrating an example of an input signal and a driving waveform.

FIG. 6 is a diagram illustrating an example of an input signal fed into the drive circuit 21 and a waveform of the driving voltage V applied by the drive circuit 21 according to the second embodiment.

In the second embodiment, every time the driving signal S1 is fed in, i.e., every time the variable capacitance element 1 is driven, the drive circuit 21 repeatedly applies the on-voltage Von having a polarity opposite to the one used in the preceding driving. In the example illustrated in FIG. 6, the on-voltage Von1 having the positive polarity is applied for individual driving at the on-times Ton1 and Ton3. Subsequent to these individual on-times, i.e., during the on-times Ton2 and Ton4, the on-voltage Von2 having the negative polarity is applied.

The polarity of the reverse polarity pulse Vps is reversed for each driving in a manner corresponding to the polarity of the on-voltage Von that is reversed for each driving.

This means that the drive circuit 21 reverses the polarity of a pair of driving voltages V consisting of the on-voltage Von and the reverse polarity pulse Vps. As a result, the waveforms of the driving voltage V becomes such rectangular waveforms in which portions corresponding individually to the on-voltage Von and the reverse polarity pulse Vps repeatedly reverse to the opposite polarities individually for each driving.

The absolute value of the reverse polarity pulse Vps is smaller than that of the on-voltage Von1 applied in the preceding driving and that of the on-voltage Von2 applied in the subsequent driving. It is preferable that the pulse application period Tps be shorter than the on-time Ton.

By performing the driving according to this embodiment, the direction of the electric field applied between the fixed electrode 12 and the movable electrode 14 turns alternately. With this arrangement, the charges of the dielectric layer 13 which could not been removed in the preceding driving can be removed to a certain extent in the subsequent driving by the on-voltage Von having a polarity opposite to the one used in the preceding driving.

Here, how much of the charges of the dielectric layer 13 can be removed depends on how many of the positions of the contact portions Tc coincide with each other between the preceding driving and the subsequent driving.

As described above, according to the driving method of the electrostatic actuator of this embodiment, the charges that could not be removed in the preceding driving can be solved in the subsequent driving by applying the reverse polarity pulse Vps having a polarity opposite to the one used in the preceding driving, and, at the same time, by reversing the polarity of the on-voltage Von for each driving.

Accordingly, when the electrostatic actuator is repeatedly driven, it is possible to further suppress the charges of the dielectric layer 13 and perform stable operation of the electrostatic actuator as compared with the driving method according to the first embodiment.

The driving methods according to the first and second embodiments described above may be applied to a variable capacitance element 2 whose movable electrode does not make direct contact with the dielectric layer.

Figure 7A:
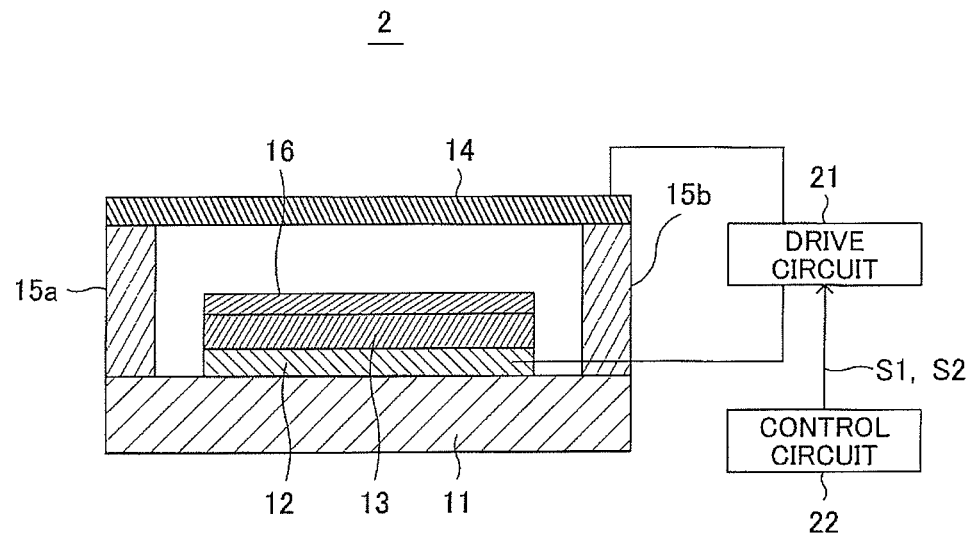
FIGS. 7A and 7B are cross sectional views illustrating an example of a variable capacitance element.
Figure 7B:
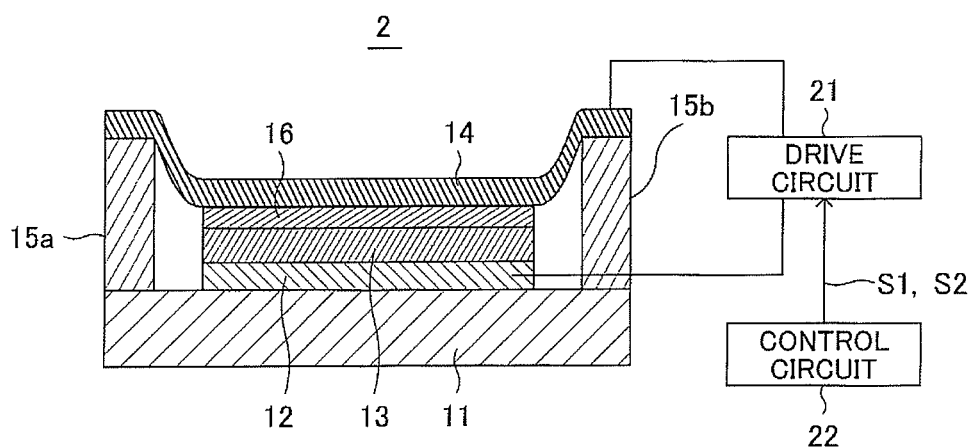
Figure 8A:
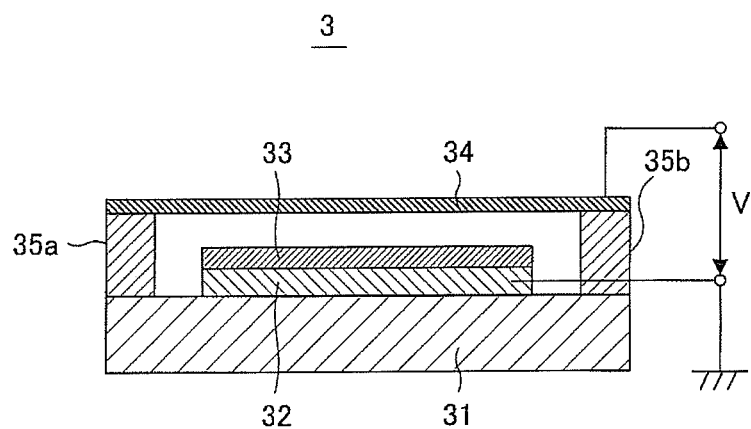
FIGS. 8A and 8B are cross sectional views illustrating an example of a conventional variable capacitance element.
Figure 8B:
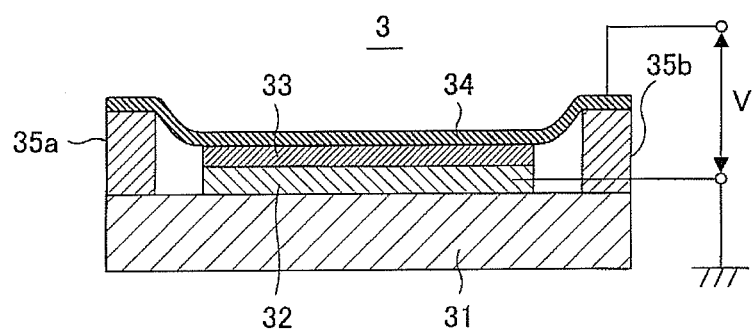
Figure 9:
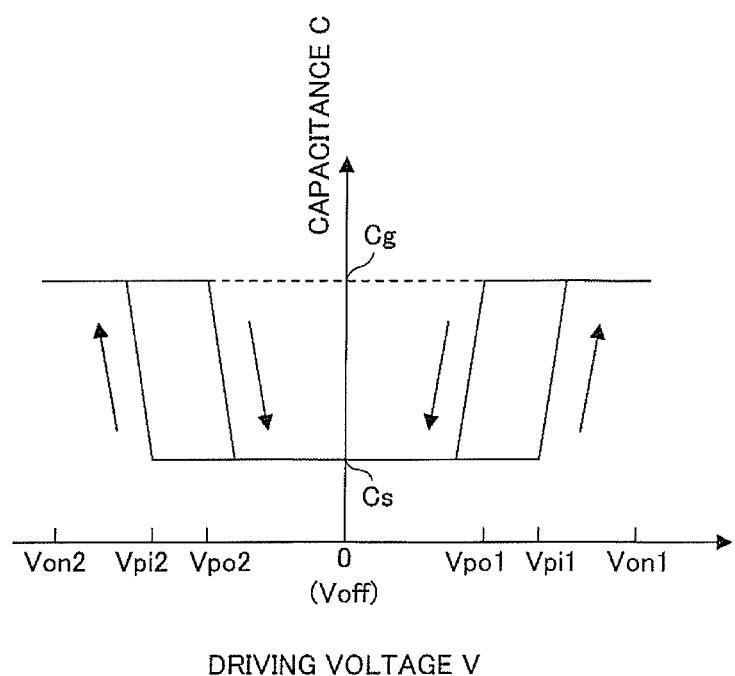
FIG. 9 is a diagram illustrating an example of a relationship (C-V characteristics) between a capacitance and a driving voltage.
Figure 10A:
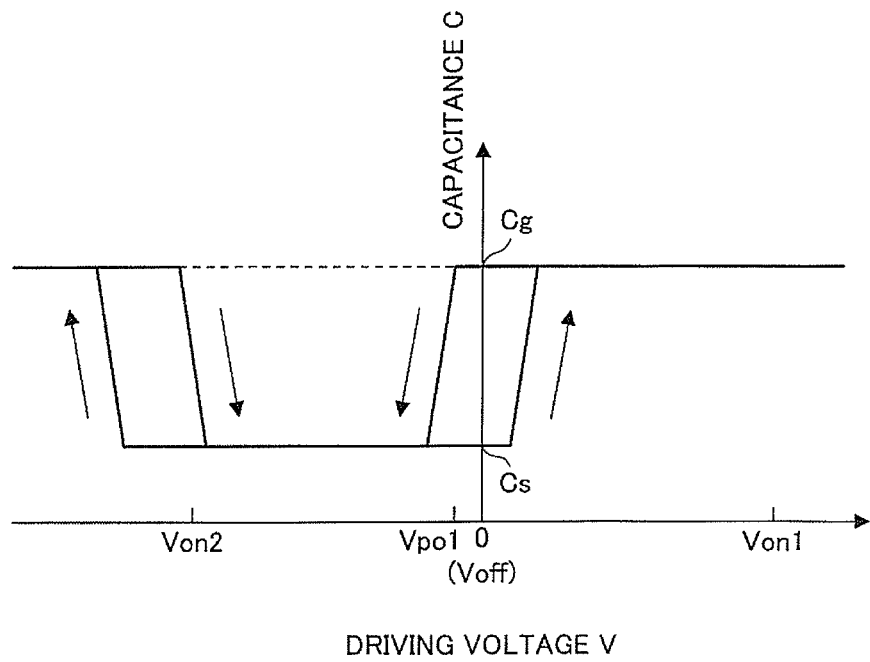
FIGS. 10A and 10B are diagrams illustrating an example of a relationship (C-V characteristics) between a capacitance and a driving voltage.
Figure 10B:
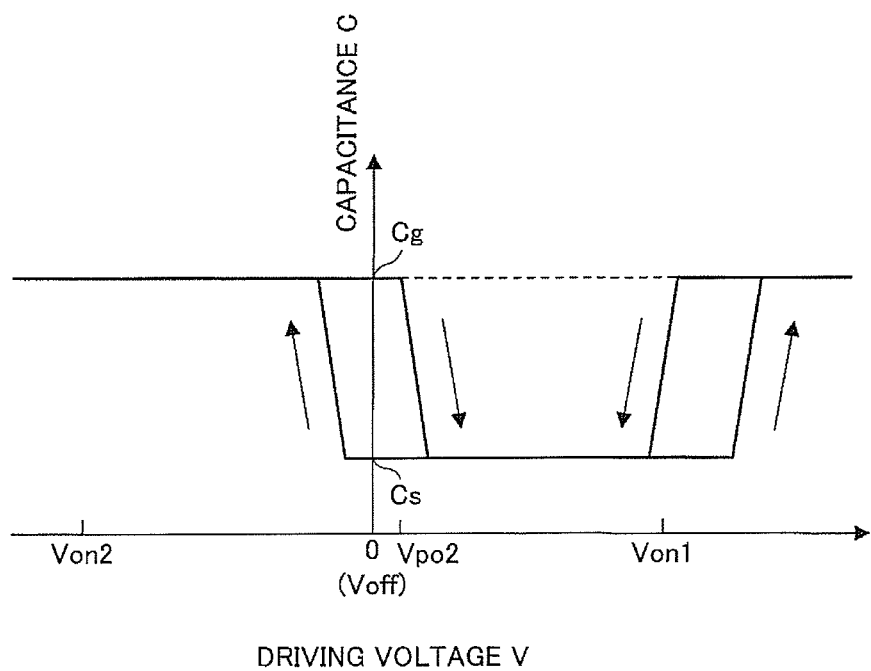
Figure 11A:
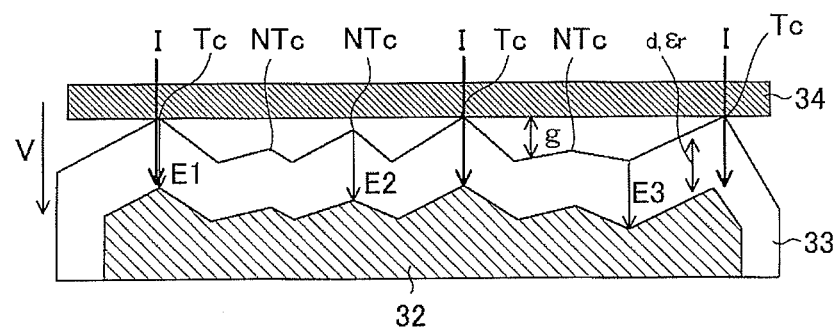
FIGS. 11A and 11B are diagrams schematically depicting a phenomenon in which charges accumulate in a dielectric layer.
Figure 11B:
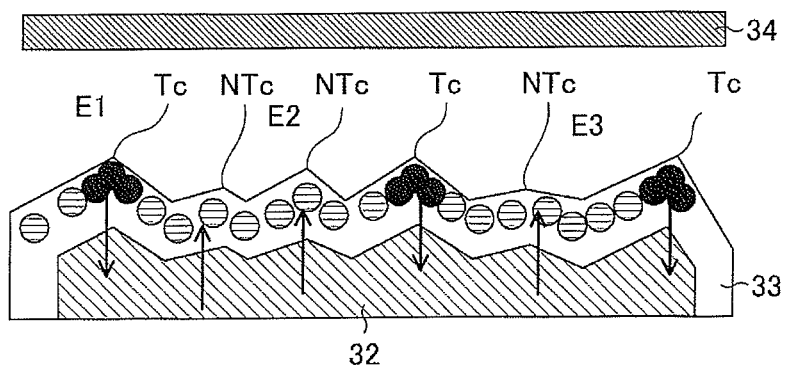

FIGS. 7A and 7B are cross sectional views illustrating an example of a variable capacitance element 2. FIG. 7A is a cross sectional view illustrating a state in which the movable electrode 14 is not displaced, and FIG. 7B is a cross sectional view illustrating a state in which the movable electrode 14 is displaced.

As illustrated in FIGS. 7A and 7B, a surface electrode 16 made of a conductive material is formed on the upper surface of the dielectric layer 13 in the variable capacitance element 2. When driven, the movable electrode 14 makes contact with an upper surface of the surface electrode 16 but not with the upper surface of the dielectric layer 13.

With this arrangement, the contact portions Tc and the non-contact portions Tc are not present on the upper surface of the dielectric layer 13 when the movable electrode 14 is driven, which causes no difference in the state of charges.

Accordingly, when the driving methods according to the first and second embodiments described above are used for the variable capacitance element 2, the charges EC injected into the dielectric layer 13 by the application of on-voltage Von or the charges EC generated by polarization are quickly released outside the dielectric layer 13 by the application of the reverse polarity pulse Vps.

To be specific, the presence of the surface electrode 16 broadens the way through which the charges EC are released, and, as a result, the charges or the polarization of the dielectric layer 13 is easily canceled.

In the embodiments described above, the pulse application period Tps is assumed to have the same period during each driving. However, it may be adjusted differently in accordance with the length of the on-time Ton during which the on-voltage Von is applied. For example, it may be adjusted to such a period proportionate to the length of on-time Ton.

Further, in the embodiments described above, the reverse polarity pulse Vps is applied after each continuous application of the on-voltage Von. However, a plurality of the reverse polarity pulses Vps may be applied in the course of each continuous application of the on-voltage Von. For example, the reverse polarity pulse Vps may be applied each time each application of the on-voltage Von reaches a predetermined time.

Further, in the embodiments described above, the drive circuit 21 switches the driving voltage V from the on-voltage Von to the reverse polarity pulse Vps. It is also possible to apply the reverse polarity pulse Vps while the on-voltage Von is continuously applied. In such a case, a drive circuit and a driving line for applying the on-voltage Von may be provided separately from a drive circuit and a driving line for applying the reverse polarity pulse Vps.

In the embodiments described above, the variable capacitance elements 1 and 2 and the driving method therefor may be altered as required in accordance with the subject matter of the present invention.

The foregoing driving method may be applied to various types of MEMS devices using an electrostatic actuator in addition to the variable capacitance elements 1 and 2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A driving method for driving an electrostatic actuator including a fixed electrode and a movable electrode opposing each other with a dielectric layer interposed therebetween, the method comprising:
applying a first voltage, between the fixed electrode and the movable electrode, to bring the movable electrode into contact with the dielectric layer; and
applying a second voltage, between the fixed electrode and the movable electrode, after application of the first voltage is stopped and before the movable electrode moves away from the dielectric layer, the second voltage having a polarity opposite to a polarity of the first voltage and an absolute value smaller than an absolute value of the first voltage,
wherein the absolute value of the second voltage is greater than a pull-off voltage between the fixed electrode and the movable electrode.

2. The driving method for driving an electrostatic actuator according to claim 1,
wherein the first voltage is repeatedly applied with a predetermined period.

3. The driving method for driving an electrostatic actuator according to claim 1,
wherein the first voltage reverses the polarity thereof each time the first voltage is applied between the fixed electrode and the movable electrode.

4. An electrostatic actuator, comprising:
a substrate;
a fixed electrode formed on the substrate;
a dielectric layer formed on the fixed electrode;
a movable electrode formed above the dielectric layer; and
a drive circuit that applies, between the fixed electrode and the movable electrode, a first voltage to bring the movable electrode into contact with the dielectric layer, and applies, between the fixed electrode and the movable electrode, a second voltage after application of the first voltage is stopped and before the movable electrode moves away from the dielectric layer, the second voltage having a polarity opposite to a polarity of the first voltage and an absolute value smaller than an absolute value of the first voltage,
wherein the drive circuit applies the second voltage of which the absolute value is greater than a pull-off voltage between the fixed electrode and the movable electrode.

5. The electrostatic actuator according to claim 4,
wherein the drive circuit applies the first voltage repeatedly with a predetermined period.

6. The electrostatic actuator according to claim 4,
wherein the drive circuit reverses the polarity of the first voltage each time the first voltage is applied.

* * * * *